United States Patent [19]

Moriyama

[11] Patent Number: 5,143,552
[45] Date of Patent: Sep. 1, 1992

[54] COATING EQUIPMENT

[75] Inventor: Masahi Moriyama, Tokorozawa, Japan

[73] Assignee: Tokyo Electron Limited, Tokyo, Japan

[21] Appl. No.: 711,729

[22] Filed: Jun. 10, 1991

Related U.S. Application Data

[63] Continuation of Ser. No. 320,619, Mar. 8, 1989, abandoned.

[30] Foreign Application Priority Data

Mar. 9, 1988 [JP] Japan .................. 63-55688

[51] Int. Cl.$^5$ .................... B05B 15/04; B05B 15/02
[52] U.S. Cl. ...................... 118/666; 118/52; 118/64; 118/319; 118/326; 118/630
[58] Field of Search .............. 118/52, 319, 326, 666, 118/64, 630; 55/101

[56] References Cited

U.S. PATENT DOCUMENTS

| | | | |
|---|---|---|---|
| 2,386,591 | 10/1945 | Campbell | 118/52 |
| 3,352,280 | 11/1967 | Hughes et al. | 118/319 |
| 3,537,425 | 11/1970 | David | 118/326 |
| 4,564,280 | 1/1986 | Fukuda | 118/52 |
| 4,895,102 | 1/1990 | Kachel et al. | 118/52 |

FOREIGN PATENT DOCUMENTS

| | | | |
|---|---|---|---|
| 2147254 | 9/1973 | France | 55/101 |
| 52-144971 | 12/1977 | Japan . | |
| 60-152029 | 8/1985 | Japan . | |
| 61-125017 | 6/1986 | Japan . | |
| 0152023 | 7/1986 | Japan | 118/52 |
| 0200224 | 9/1986 | Japan | 118/52 |
| 0046519 | 2/1987 | Japan | 118/666 |
| 0214621 | 9/1987 | Japan | 118/666 |

*Primary Examiner*—Willard Koag
*Attorney, Agent, or Firm*—Oblon, Spivak, McClelland, Maier & Neustadt

[57] ABSTRACT

Coating equipment, which is installed in a clean room where air flows in a vertical laminar flow, comprises coating apparatus, for applying a resist, having a spin chuck connected to a motor and used to hold a semiconductor wafer and a cup with an inlet port to draw in a vertical laminar flow from the clean room and enclosing the wafer held on the spin chuck, and a control apparatus to control the temperature and humidity of the vertical laminar flow supplied to the coating apparatus. A vertical laminar flow control in temperature and humidity by the control apparatus is always supplied to the wafer in the cup during the coating process of a semiconductor wafer.

15 Claims, 4 Drawing Sheets

COATING EQUIPMENT

This application is a continuation of application Ser. No. 07/320,619, filed on Mar. 8, 1989, now abandoned.

BACKGROUND OF THE INVENTION

1. Field of the Invention

This invention relates to coating equipment comprising a coating apparatus for applying a coating material to an object.

2. Description of the Related Art

Among methods used to apply a resist to a semiconductor wafer, as an object to be coated, that disclosed in Japanese Patent Disclosure No. 52-144971 is well known. According to this method, a resist is applied to a semiconductor wafer by a spin coater installed in a clean room. A semiconductor wafer is held on a spin chuck by vacuum chucking with its surface to be coated up. The spin chuck is positioned in a cup having at the top end an inlet port for introducing a vertical laminar flow from the clean room. While the wafer is rotated at high speed by a motor connected to the spin chuck, a resist is dispensed onto the center surface of the wafer and is spread out over the entire surface by centrifugal force.

However, when a resist is applied to a wafer by an apparatus such as described above, there is a problem that the change of the resist temperature on the resist layer applied causes the wafer to be nonuniform in thickness.

A technique has been developed with the aim of solving this problem, for example that disclosed in Japanese Patent Disclosure No. 61-125017. According to the technique disclosed therein, the resist temperature is prevented from changing by it being controlled during coating on the surface of a semiconductor wafer.

For the step of developing the pattern-exposed resist layer on a semiconductor wafer, a method has been devised in which the semiconductor wafer is held surface up on a spin chuck provided in a cup having at top end an inlet port for introducing a vertical laminar flow from a clean room by a vacuum, and a developer is supplied from a spray nozzle onto that surface of the wafer to be developed while the wafer is either rotated at low speed by a motor connected to the spin chuck or is stationary. Then, the wafer is rotated at high speed by the motor, to spin off the remaining developer by centrifugal force. Also in this case, there is a problem that nonuniform development occurs in the developed pattern on the wafer due to the temperature change of the developer as in the resist coating described above. A method has been developed with the aim of solving this problem, the method comprising the step of applying a developer by controlling the temperature of the developer to restrain the temperature change of the resist.

However, when a resist or a developer is applied on a semiconductor wafer in a cup with a vertical laminar flow introduced from the clean room, as described above, the resist and developer supplied to the wafer is affected by the temperature and humidity of the atmosphere in the cup even if the temperature of the resist or developer is controlled. Thus, the change in the temperature and humidity of the atmosphere in the cup makes it impossible to obtain a desirable resist thickness and a desirable developed pattern or to achieve desired uniformity in the resist thickness and pattern development. This results in low yield and productivity.

Figure 1:
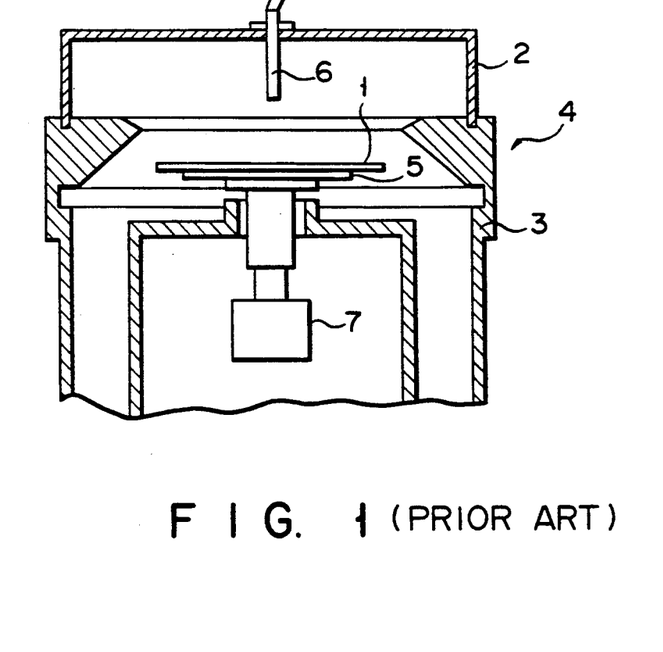
FIG. 1 is a sectional view schematically showing the construction of a conventional coating apparatus.

As for the technique for stabilizing the atmosphere around a wafer, there is one disclosed in Japanese Patent Disclosure No. 60-152029. This technique will be described referring to FIG. 1. In FIG. 1, semiconductor wafer 1 held on spin chuck 5 is totally enclosed by cover 4 comprising lower cup 3 and upper cup 2. Under this condition, a resist is dropped to the center of wafer 1 from nozzle 6. Then, the solvent contained in the resist evaporates. Since an inner space of cover 4 is saturated with the solvent vapor, the temperature and humidity around semiconductor wafer 1 are constant. By rotating wafer 1 under this condition by motor 7, it can be expected that a uniform resist layer is formed on the surface of wafer 1.

With this technique, however, there is a possibility that the resist or developer spun off by the rotation of wafer 1 sticks to the internal wall of cover 4. When the substance sticking to the wall is thickly stacked, the substance exfoliates by a small force and contaminates the atmosphere in the cup and dust thus produced adheres to semiconductor wafer 1. As the integration in wafer 1 advances from 256K bits to 1M bits or 4M bits, it becomes necessary to improve the cleanness of the atmosphere. However, the above-mentioned technique has a problem that the dust adhesion to the wafer, which is inevitable with this technique, inhibits a required cleanness from being achieved, resulting in low yield and productivity.

SUMMARY OF THE INVENTION

This invention has been made to solve the above problem with the conventional technique and has as its object to provide coating equipment capable of applying a coating material to an object with a desired cleanness maintained and without being affected by the temperature and humidity of the atmosphere.

Coating equipment according to this invention comprises a coating apparatus for applying a resist or developing material to an object while supplying a vertical laminar air flow to the object and control means to control the temperature and humidity of the vertical laminar gravity air flow supplied to the coating apparatus.

DETAILED DESCRIPTION OF THE PREFERRED EMBODIMENT

With reference to the accompanying drawings, embodiments of this invention will be described in detail.

In these embodied examples, this invention is applied to the application of resist to semiconductor wafers in the fabrication of semiconductor devices.

Figure 2:
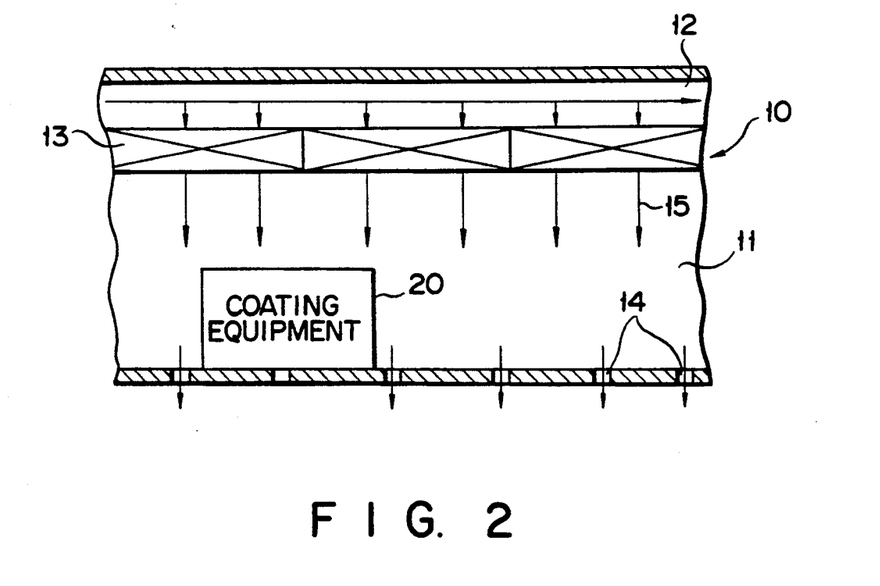
FIG. 2 is a schematic view showing the installed state of coating equipment according to an embodiment of this invention.

FIG. 2 is a drawing to explain the installed state of coating equipment according to this invention. In FIG. 2, the numeral 10 indicates a clean room in which coating equipment is installed. Clean room 10 has air passage 12 provided along the ceiling to supply air from a blower (not shown). Just below air passage 12, there is provided filter 13 through which the air supplied to passage 12 flows and is guided to the whole area of main body 11 of clean room 10, forming vertical laminar flow of clean air 15.

Figure 3:
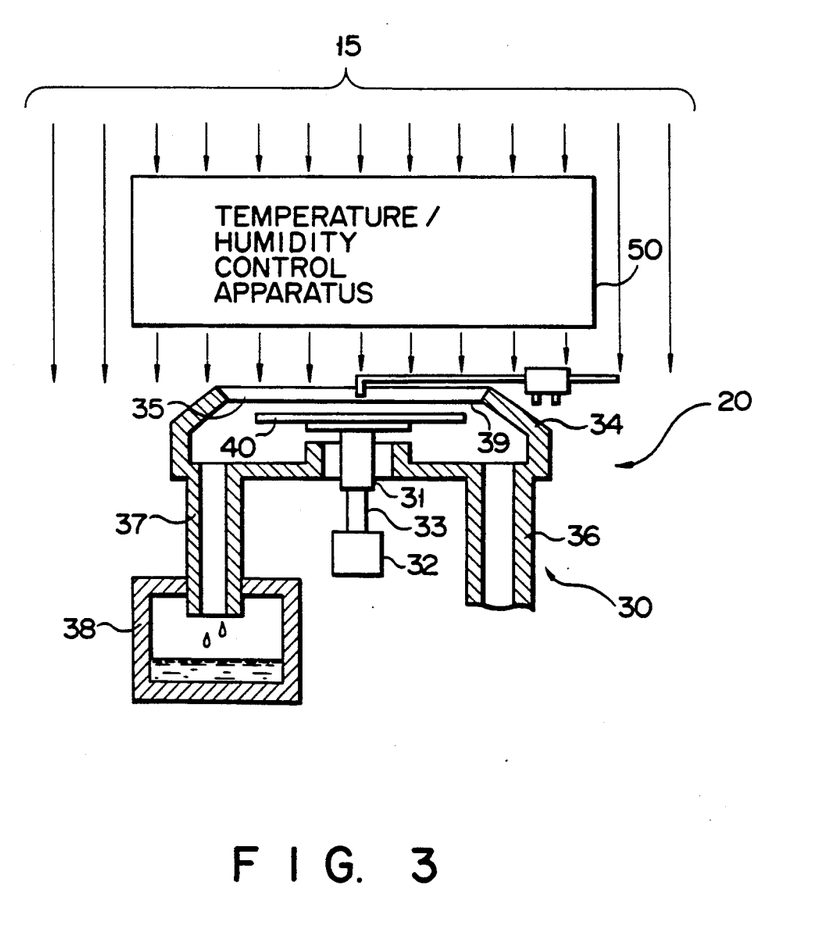
FIG. 3 is a sectional view schematically showing the construction of coating equipment according to an embodiment of this invention.

As shown in FIG. 3, coating equipment 20 comprises coating apparatus 30 which applies a resist to a semiconductor wafer, and temperature/humidity control apparatus 50 which controls the temperature and humidity of vertical laminar flow 15 supplied vertically to the wafer.

Coating apparatus 30 comprises spin chuck 31 to support wafer 40 by vacuum chucking, such that the wafer is horizontal and rotatable. Spin chuck 31 is connected to output shaft 33 of spin motor 32 and is rotated by motor 32 at a rotating speed of up to 8000 rpm for example. An AC servo motor may be used for motor 32.

Substantially cylindrical cup 34, made of resin or stainless steel, is provided in such a way so as to enclose wafer 40 on spin chuck 31. Cup 34 has, formed at the top thereof, inlet opening 35 for vertical laminar gravity flow 15 of clean room 10. The upper portion of the circumferential wall of cup 34 is sloped to form an acute angle with the bottom wall.

Exhaust pipe 36, connected to an exhaust (not shown), to vent the air from cup 34 so as to form a vertical laminar flow in cup 34, and drain pipe 37 to discharge the used resist are provided at the bottom of cup 34. Drain pipe 37 is connected to drain box 38, which may be a cubic vinyl chloride box, in which the used waste resist coming through drain pipe 37 is accumulated.

Above wafer 40, which is supported by spin chuck 31, resist drip nozzle 39 is provided to dispense a resist liquid to a position near about the center of wafer 11. Resist nozzle 39 is connected to a pipe (not shown) leading to a resist container (not shown) containing a resist liquid. When a bellows pump (not shown) provided in the middle of this pipe is put into operation, the resist liquid is supplied through this pipe to nozzle 39, which may be made of, for example, tetrafluorethylene resin or stainless steel. Part of resist drip nozzle 39 is surrounded by double-pipe temperature controller 41. In this temperature controller 41, constant-temperature water set at a specified temperature is supplied from a thermostatic bath (not shown) and is circulated through pipes 42 and 43, thereby keeping the resist liquid supplied from the resist drip nozzle at a constant temperature.

Figure 4:
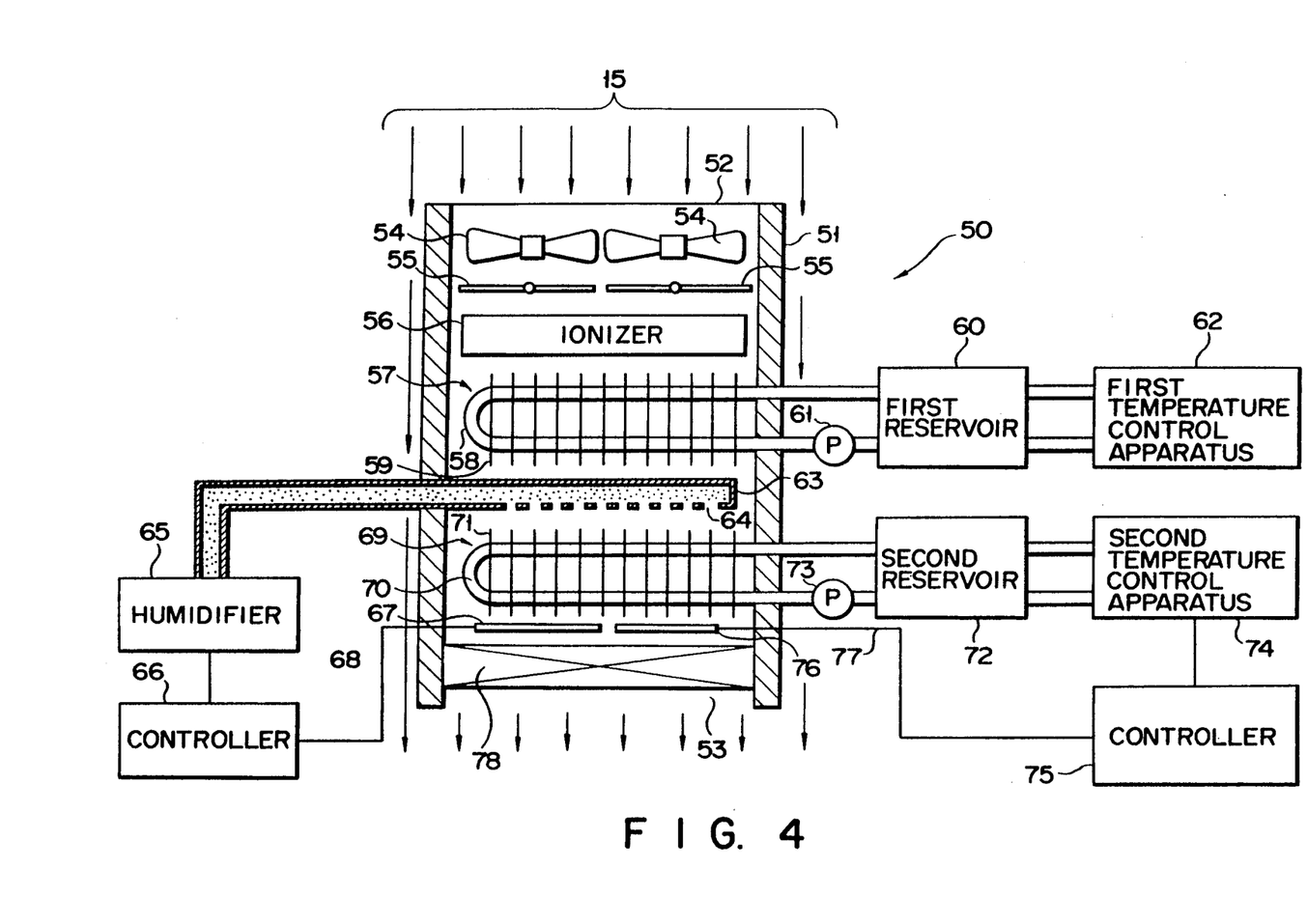
FIG. 4 is a sectional view showing a temperature/himidity a control apparatus in coating equipment shown in FIG. 3.

As shown in FIG. 4, temperature/humidity control apparatus 50 is provided right above inlet opening 35 of cup 34. This temperature/humidity control apparatus 50 comprises rectangular housing 51 having openings 52 and 53 at the upper and lower ends thereof, respectively. Vertical laminar flow 15 is drawn in through opening 52, its temperature and humidity are controlled, and air is exhausted from opening 53.

Housing 51 is provided near opening 52 with two fans 54, by which vertical laminar flow 15 can be guided forcibly into housing 51. Below fans 54, damper 55 is provided for control of the air flow rate. Provided further down are ionizer 56, to eliminate the static electricity of the dust in laminar flow 15 and thereby improving the purity of the vertical laminar air flow.

Below ionizer 56, first heat exchanger 57 comprising cooling water pipe 58 and fins 59 is provided. By this heat exchanger 57, vertical laminar flow 15 drawn into housing 51 is cooled, causing dew to condense and reducing the humidity of the air flow. Pipe 58 of first heat exchanger 57 is connected to first reservoir 60 which stores cooling water, and pipe 58 has pump 61 connected therein. Therefore, when pump 61 is operated, water in reservoir 60 is circulated through pipe 58. First reservoir 60 is connected with first temperature control apparatus 62 which can heat and cool the water. This first temperature control apparatus 62 is used to set the temperature of cooling water circulating in pipe 58 at a specified value.

Humidifying pipe 63, having a plurality of bores 64, is provided under first heat exchanger 57. Humidifying pipe 63 is connected to humidifier 65 provided outside housing 51. Humidifier 65 employs ultrasonic waves to evaporate the solvent for a resist, for example. The vapor thus produced is supplied through humidifying pipe 63 into housing 51. Humidifier 65 is connected with controller 66, which is in turn connected through cable 68 to humidity sensor 67 provided below second heat exchanger 69 which will be described later. Therefore, a signal corresponding to humidity detected by humidity sensor 67 is output to controller 66 which, according to this signal, outputs a control signal to humidifier 65. By this feedback control system, the humidity of vertical laminar flow 15 supplied from housing 51 to coating apparatus 30 is controlled.

Under humidifying pipe 63, second heat exchanger 69 comprising temperature controlling water pipe 70 and fins 71 is provided, whereby the temperature of vertical laminar flow 15 supplied from housing 51 to coating apparatus 30 is set at a specified level. Pipe 70 of this second heat exchanger 69 is connected to second reservoir 71 where water for temperature control is stored. Pipe 70 has pump 73 connected therein. Therefore, the water in reservoir 72 is circulated by pump 73 through pipe 70. Second reservoir 72 is connected with second temperature control apparatus 74 which can heat and cool the temperature controlling water. This temperature control apparatus is connected with controller 75 which is connected through cable 72 to temperature sensor 76 provided below second heat exchanger 69. Therefore, a signal corresponding to a temperature detected by temperature sensor 76 is output to controller 75 which, according to this signal, outputs a control signal to second temperature control apparatus 74 which controls the temperature of the water circulating in pipe 70. Under this feedback control system the temperature of vertical laminar flow 15 supplied from housing 51 to coating apparatus 30 is controlled.

Filter 78 is provided near opening 53 of housing 51 and under humidity sensor 67 and temperature sensor 76. As vertical laminar flow 15 passes through filter 78, the cleanliness of vertical laminar flow 15 is further improved. A HEPA filter may be used for filter 78.

In this coating equipment 20, the coating operations is set and controlled by a control section, not shown.

A description will now be made of the application operation of resist in coating equipment 20 composed as described.

Semiconductor wafer 40 as an object to be processed is conveyed above spin chuck 31 by a transfer mechanism (not shown) using a belt conveyor, for example.

The center of wafer 40 is aligned with the center of spin chuck 31 and wafer 40 is placed thereon. In the above alignment, wafer 40 can be held by two holding members (not shown) which together form a shape that fits the periphery of the wafer and under this condition, the center of wafer 40 can be aligned with spin chuck 31.

Wafer 40 placed on spin chuck 31 is attached to chuck 31 by vacuum chucking done by a vacuum mechanism, not shown.

When wafer 40 is transferred onto chuck 31, cup 34 is withdrawn by an elevator device (not shown) downwardly so as not to be in the way of the transfer of wafer 40. After wafer 40 is held on chuck 31, cup 34 rises to the position shown in FIG. 2.

Then, a resist is dispensed to the center of wafer 40 on chuck 31 from resist drip nozzle 39.

As described above, the resist is supplied from a resist container through a pipe, first to temperature controller 41. As constant-temperature water set at a specified temperature and supplied from a thermostatic bath is circulated through temperature controller 41 via pipes 42 and 43, the resist dispensed onto wafer 40 through resist drip nozzle 39 is controlled at a constant temperature of 24° C., for example. Supposing that the amount of resist required for one wafer is 3 cc for example, the amount of resist, the temperature of which can be controlled at a time, is about three times the required amount, namely, 10 cc.

By making the resist passage in temperature controller 41 in a coil or spiral form, the amount of resist that can be controlled in temperature at one time can be increased, making highly-efficient temperature control possible.

For example, 3 cc of a resist thus temperature-controlled is applied onto the surface of wafer 40 from nozzle 39, wafer 40 is accelerated at 50000 rpm/sec and is rotated at high speed, 4000 rpm for example, thereby making the resist spread out. Then, wafer 40 is further rotated to dry the uniformly applied resist.

During this application process, the air in cup 34 is drawn off by an exhaust, not shown, through exhaust pipe 36 according to a preset program.

The resist spun off of the edge of wafer 40 due to its rotation adheres to the inside surface of the upper, sloped portion of the circumferential wall of cup 34 and falls outside wafer 40. To be more specific, the spun-off resist is prevented from splashing back from the sloped cup-wall to wafer 40, by passing through drain pipe 37 and accumulating in drain box 38.

As described above, the air in cup 34 is exhausted during the resist application process. Therefore, vertical laminar flow 15 controlled in temperature and humidity by the temperature/humidity control apparatus is always supplied to cup 34. In other words, vertical laminar gravity flow 15 of clean room 10, drawn forcibly into housing 51 by fans 54 through opening 52 at the top end of housing 51, is supplied through damper 55 and ionizer 56 to first heat exchanger 57. Then, as mentioned earlier, the amount of wafer vapor from humidifier 65 and the temperature of water flowing in second heat exchanger 69 are controlled by controllers 66 and 75 operated according to the values detected by humidity sensor 67 and temperature sensor 76. As a result, the temperature and humidity of vertical laminar flow 15 are controlled. In this manner, vertical laminar flow 15, controlled in temperature and humidity at desired values, is supplied through filter 78 into cup 34.

Therefore, a desired atmosphere is always maintained in cup 34, eliminating problems resulting from changes in the temperature and humidity around wafer 40 during the resist application. Specifically, a resist layer with a desired thickness can be obtained on wafer 40 and the uniformity of the resist layer can be improved. In consequence, the yield and productivity can be improved substantially. Furthermore, even when the temperature or humidity changes in the clean room, the effects of such changes can be avoided by controlling the temperature and humidity in cup 34, in the manner described above.

In addition, vertical laminar flow 15 cleaned by ionizer 56 and filter 78 is supplied into cup 34, thus keeping the atmosphere in cup 34 extremely clean. This prevents semiconductor wafer 40 from being contaminated by dust and further improves yield and productivity.

Further, in the above embodiment, since vertical laminar flow 15 is drawn in forcibly by fans 54, the amount of air exhausted from cup 34 can be balanced with the amount of vertical laminar flow 15 supplied into cup 34. Consequently, the turbulence of the air flow in cup 34 can be prevented, minimizing chances for the spun-off resist to adhere to wafer 40. It is also possible to control the amount of the exhausted air by installing a butterfly-shaped damper in exhaust pipe 36 and by turning this damper to vary the exhaust area of exhaust pipe 36. In this way, the turbulence in cup 34 can be reduced further. The damper can be turned by the use of a rotary actuator such as a rotary cylinder. According to the purpose, it is possible to use an autodamper which automatically selects whether or not to exhaust the air, a linear damper which precludes the effects of changes in the exhaust air, a sequential damper capable of a multi-step change of the amount of the exhaust air, or a combination of them.

After the application of a resist on wafer 40 has been completed, wafer 40 is removed from coating apparatus 30 and carried to the outside of the apparatus by said transfer mechanism, not shown. A series of resist application steps are thus finished.

Figure 5:
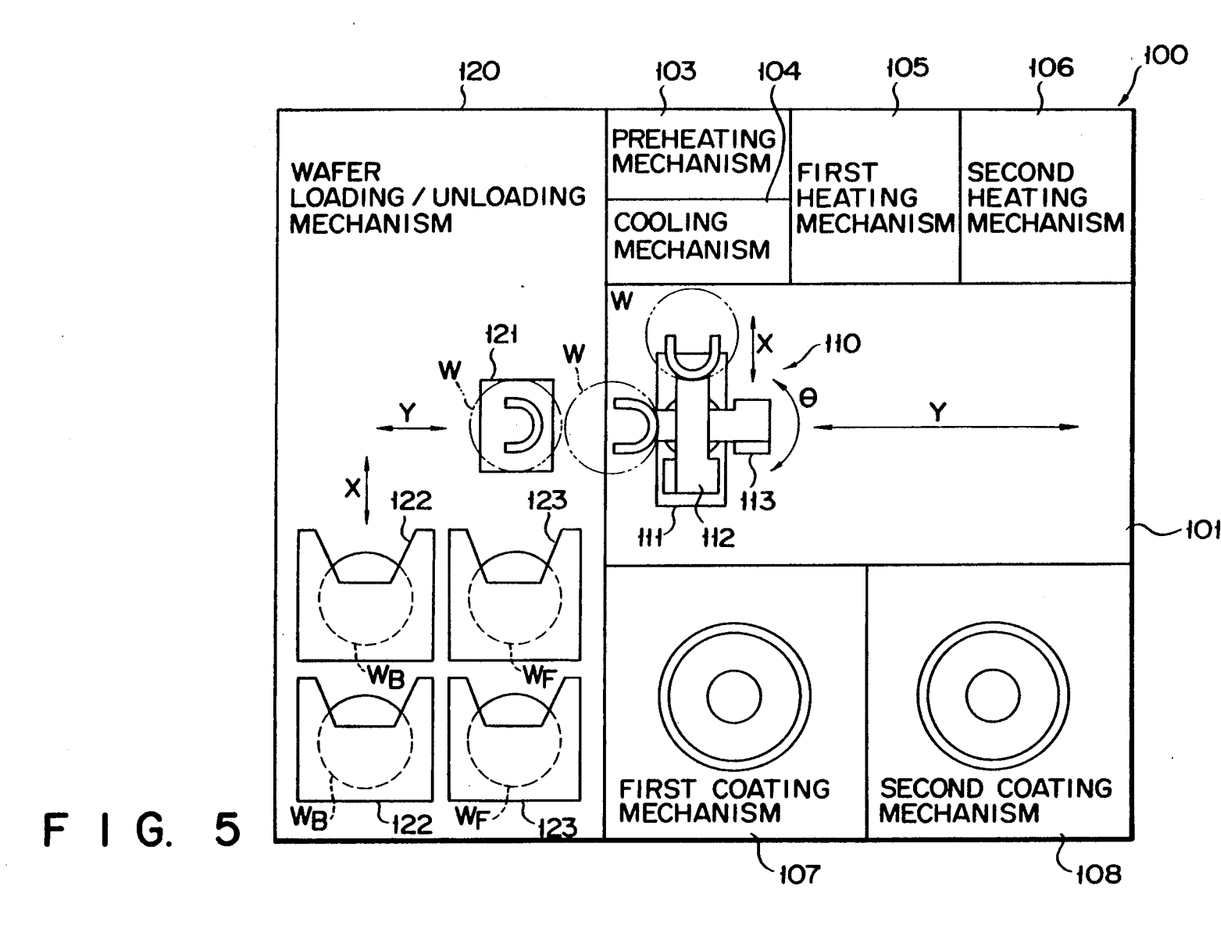
FIG. 5 is a schematic diagram of a coating apparatus which is applied to another embodiment of this invention.

Next, description will be made of an embodiment in which this invention is applied to coating apparatus 100 described in Japanese Patent Application No. Sho 63-30219 filed by the same assignee as that of the present invention (application date: Feb. 12 1988, inventors: Mitsuru USHIJIMA et al.) with reference to FIG. 5. This coating apparatus 100 is capable of the entire series of steps in the coating process from the transfer of a semiconductor wafer. Coating apparatus 100 comprises basic frame 101 and component mechanisms mounted thereon, which include preheating mechanism 103. cooling mechanism 104, first heating mechanism 105, second heating mechanism 106, first coating mechanism 107 and second coating mechanism 108. In the middle of basic frame 101, passage 102 is provided which extends in the direction of the arrow Y (horizontal direction). On one side of the passage, preheating mechanism 103, cooling mechanism 104, first heating mechanism 105 and second heating mechanism 16 are provided. On the other side, first coating mechanism 107 and second coating mechanism 108 are provided. Though FIG. 5 shows that preheating mechanism 103 and cooling mechanism 104 are arranged adjacent each other, in actuality cooling mechanism 104 is installed below preheating mechanism 103.

In passage 102, a wafer transfer apparatus is provided which moves therethrough. This transfer apparatus 110 comprises main body 111 and two tweezers 112 and 113 for holding a wafer by vacuum chucking. Main body 111 can move in the Y direction through passage 102. Tweezers 112 and 113 can each move independently in the Y (horizontal) direction, X (longitudinal) direction, Z (vertical) direction and $\theta$ rotational direction. By the use of these tweezers 112 and 113, wafer W is transferred to and from any of said processing mechanisms 103 through 108 and wafer W is taken into and out of a wafer loading/unloading mechanism which will be described in the following.

Wafer loading/unloading mechanism 120 is installed adjacent to basic frame 101. This wafer loading/unloading mechanism 120 incorporates wafer cassettes 122 containing wafers $W_B$ before processing and wafer cassettes 123 containing wafers $W_F$ that have been processed. Wafer loading/unloading mechanism 120 comprises tweezers 121 capable of holding wafer W by vacuum chucking and moving it in the X and Y direction. Using tweezers 121, wafer loading/unloading mechanism 120 takes out a wafer to be processed from cassette 122 and receives a processed wafer from the tweezers of wafer transfer apparatus 110. Wafer W is handed over between tweezers 112, 113 of transfer apparatus 110 and tweezers 121 at the interface between passage 102 and wafer loading/unloading mechanism 120.

First and second coating mechanisms 107 and 108 are of the same construction as coating apparatus 30 described earlier and can apply a resist, for example, to wafer W.

Coating apparatus 100 as described is installed under a vertical laminar flow of air, for example in a clean room with a down flow, and above this coating apparatus, an apparatus similar to the temperature/himidity control apparatus as previously described is installed. In this case, the vertical laminar flow controlled in temperature and humidity need not necessarily be supplied to the whole body of coating apparatus 100 but has only to be supplied vertically to at least the wafers set at first and second coating mechanisms 107 and 108.

With the coating apparatus as described, it is possible to perform a series of coating steps including preheating, cooling, prebaking, application of resist, for example, and postbaking, and it is also possible to arbitrarily set a procedure for those steps. Further, since two pairs of tweezers can be operated independently of each other, and heating mechanisms and coating mechanisms are provided in pairs, a plurality of wafers can be processed simultaneously, making the coating process very efficient.

As has been described, according to these embodiments, objects set on a coating apparatus such as wafers are supplied with a vertical laminar flow controlled in temperature and humidity by a temperature/humidity control apparatus. Therefore, it is possible to prevent adverse effects due to changes in the temperature and humidity of the atmosphere around the coating object from being exerted on the coating process, therefore the cleanliness of the object to be processed can be improved significantly.

This invention is not limited to the above embodiments but may be embodied in various forms. For example, in the temperature/humidity control apparatus, the temperature and humidity are controlled by heat exchangers and a humidifier using ultrasonic waves in the above embodiments. However, any devices that can control temperature and humidity may be used. Peltier elements may be used for heat exchange and bubbling may be used for humidification.

The coating equipment in the above embodiments are used for applying a resist to semiconductor wafers. The coating equipment according to this invention, however, may be applied to a process for applying a developing material for developing a pattern-exposed resist layer on the surface of a wafer using the same coating equipment as shown in FIG. 3. In short, this invention can be applied to equipment where a coating material is applied to an object by the spin method. Supposing that in coating apparatus 100 described above, second coating mechanism 108 is converted into a developing mechanism of basically the same construction as coating apparatus 30 and some contrivance is made so that wafers are exchanged with an exposure apparatus at the right end of passage 102, then a coating apparatus capable of doing a series of steps from resist application to exposure can be obtained. This invention can thus be applied to such an apparatus.

Wafers are used as coating objects in the above embodiments. However, this invention may be applied to coating masks or the like.

What is claimed is:

1. Coating equipment comprising:
   a coating apparatus including a plurality of processing units for performing a series of steps from application of a resist or a developing agent to the surface of an object to be coated to form a coating layer on the object, a transfer mechanism for transferring the object from a certain processing unit to another processing unit, and a passage for said transfer mechanism, the surface of the object being supported horizontal at least during the coating step of the resist or the developing agent;
   vertical down flow-generating means for generating a vertical down flow of clean air, which is supplied from above the object to the entire surface region of the object at least during the coating step of the resist or the developing agent;
   exhaust means for exhausting vertically downward the air supplied to the object; and
   control means for controlling the temperature and humidity of the air which is to be supplied to the object.

2. Coating equipment comprising:
   a coating apparatus for coating the surface of an object to be coated with a resist or a developing agent, said coating apparatus including support means for supporting said object such that the surface thereof is held horizontal, and supply means for supplying a resist or a developing agent to the surface of the object;
   vertical down flow-generating means for generating a vertical down flow of clean air, which is supplied from above the object to the entire surface region of the object;
   exhaust means for exhausting vertically downward the air supplied to the object; and
   control means for controlling the temperature and humidity of the air which is to be supplied to the object.

3. Coating equipment according to claim 2, wherein said control section comprises a dehumidifier to dehumidify the air flow, a humidity control apparatus to control the dehumidified air flow to a desired humidity by humidifying the air flow, and a temperature control apparatus to control the dehumidified air flow to a desired temperature.

4. Coating equipment according to claim 2, wherein said control means is disposed right above said coating apparatus, to supply the air flow controlled in temperature and humidity to said coating apparatus.

5. Coating equipment according to claim 1, further comprising a fan for forcibly guiding the air flow into a housing.

6. Coating equipment according to claim 2, further comprising a damper for controlling the flow amount of the air flow of clean air.

7. Coating equipment according to claim 2, further comprising an ionizer for eliminating dust from the air flow of clean air.

8. Coating equipment according to claim 2, further comprising a fan for guiding air to the object through the air inlet.

9. Coating equipment according to claim 2, wherein the control means has a temperature sensor and a humidity sensor both provided right above the object.

10. Coating equipment according to claim 2, wherein the control means has first means for cooling air to be supplied to the object, thereby dehumidifying the air, second means for heating the air to a predetermined temperature in response to a detection signal from the temperature sensor, and third means for humidifying the air to a predetermined humidity in response to a detection signal from the humidity sensor.

11. Coating equipment according to claim 2, further comprising a filter provided right above the object for trapping dust in the air flow.

12. The coating equipment according to claim 2 wherein said coating apparatus further includes rotating means for rotating said support means, and surrounding means for surrounding the periphery of the object supported by the support means, said surrounding means having an opening positioned above the object supported by the support means such that a down flow of clean air can be supplied to the entire surface of the object.

13. Coating equipment according to claim 12, wherein said enclosing member of said coating apparatus has an exhaust pipe in a bottom thereof to exhaust the air from said enclosing body.

14. The coating equipment according to claim 2, wherein said vertical down flow-generating means includes an auxiliary chamber positioned right above said object such that the longitudinal direction of said auxiliary chamber is vertical, and an air supply source for supplying clean air from the upper end portion of the auxiliary chamber into the auxiliary chamber, the clean air supplied to the auxiliary chamber forming a vertical down flow within the auxiliary chamber.

15. The coating equipment according to claim 14, wherein said vertical down flow-generating means further includes a diffusing member disposed right under said auxiliary chamber for diffusing the clean air.

* * * * *

UNITED STATES PATENT AND TRADEMARK OFFICE
CERTIFICATE OF CORRECTION

PATENT NO. : 5,143,552

DATED : September 1, 1992

INVENTOR(S) : Masashi Moriyama

It is certified that error appears in the above-identified patent and that said Letters Patent is hereby corrected as shown below:

On the Title page, item [75]

The inventor's name is spelled incorrectly, should be, --Masashi Moriyama --.

Signed and Sealed this

Nineteenth Day of October, 1993

Attest:

BRUCE LEHMAN

Attesting Officer

Commissioner of Patents and Trademarks